United States Patent
Takeda (10) Patent No.: US 7,301,826 B2
(45) Date of Patent: Nov. 27, 2007

(54) MEMORY, PROCESSING SYSTEM AND METHODS FOR USE THEREWITH

(75) Inventor: Fujio Takeda, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/652,327

(22) Filed: Jan. 11, 2007

(65) Prior Publication Data

US 2007/0109890 A1    May 17, 2007

Related U.S. Application Data

(62) Division of application No. 11/257,816, filed on Oct. 25, 2005, now Pat. No. 7,212,458.

(51) Int. Cl.
*G11C 7/10* (2006.01)
*G11C 7/00* (2006.01)

(52) U.S. Cl. .................. 365/189.02; 365/203; 365/204

(58) Field of Classification Search ............ 365/189.02
See application file for complete search history.

(56) References Cited

U.S. PATENT DOCUMENTS

| | | | |
|---|---|---|---|
| 6,144,584 A * | 11/2000 | Kunori et al. ......... | 365/185.18 |
| 6,195,295 B1 * | 2/2001 | McPartland ............ | 365/189.05 |
| 6,301,173 B2 * | 10/2001 | Fujioka et al. ............. | 365/203 |
| 6,563,743 B2 * | 5/2003 | Hanzawa et al. ....... | 365/189.02 |
| 6,762,959 B2 * | 7/2004 | Kim ...................... | 365/189.09 |
| 6,795,358 B2 * | 9/2004 | Tanaka et al. ............. | 365/203 |
| 6,977,856 B2 * | 12/2005 | Tanaka et al. ............. | 365/202 |
| 7,151,696 B2 * | 12/2006 | Suh et al. ............. | 365/185.25 |
| 2005/0105326 A1 * | 5/2005 | Hanzawa et al. ........... | 365/154 |
| 2005/0265096 A1 * | 12/2005 | Obara et al. ................ | 365/203 |
| 2006/0062061 A1 * | 3/2006 | Suh et al. .................... | 365/203 |
| 2006/0171204 A1 * | 8/2006 | Del Gatto et al. ...... | 365/185.18 |

* cited by examiner

*Primary Examiner*—Son L. Mai
(74) *Attorney, Agent, or Firm*—Garlick Harrison & Markison; Bruce E. Stuckman (57) ABSTRACT

A memory includes a selected bitline coupled to the array of memory cells. A column voltage booster produces a boosted column enable signal. A column multiplexer passes a signal on the selected bitline as a sense amplifier input in response to the boosted column enable signal. A sense amplifier produces a data output.

6 Claims, 12 Drawing Sheets

MEMORY, PROCESSING SYSTEM AND METHODS FOR USE THEREWITH

CROSS REFERENCE TO RELATED PATENTS

The present application is a divisional application of the application having Ser. No. 11/257,816 U.S. Pat. No. 7,212,458, entitled, MEMORY, PROCESSING SYSTEM AND METHODS FOR USE THEREWITH, filed on Oct. 25, 2005, the contents of which are incorporated herein by reference thereto.

BACKGROUND OF THE INVENTION

1. Technical Field of the Invention

The present invention relates to memory circuits such as static random access memories and related methods.

2. Description of Related Art

As is known, integrated circuits are used in a wide variety of electronic equipment, including portable, or handheld, devices. Such handheld devices include personal digital assistants (PDA), CD players, MP3 players, DVD players, AM/FM radio, pagers, cellular telephones, computer memory extension (commonly referred to as a thumb drive), etc. Each of these handheld devices includes one or more integrated circuits to provide the functionality of the device. As an example, a handheld FM radio receiver may include multiple integrated circuits to support the reception and processing of broadcast radio signals in order to produce an audio output that is delivered to the user through speakers, headphones or the like. Many such integrated circuits include a processing device that executes a program that includes a sequence of instructions that are stored in a memory device such as a random access memory (RAM). These devices are typically powered from a small battery that has a limited capacity. Reduced power consumption is an important consideration for these devices in order to increase the amount of time the device can operate before the battery needs to be recharged or replaced.

Figure 1:
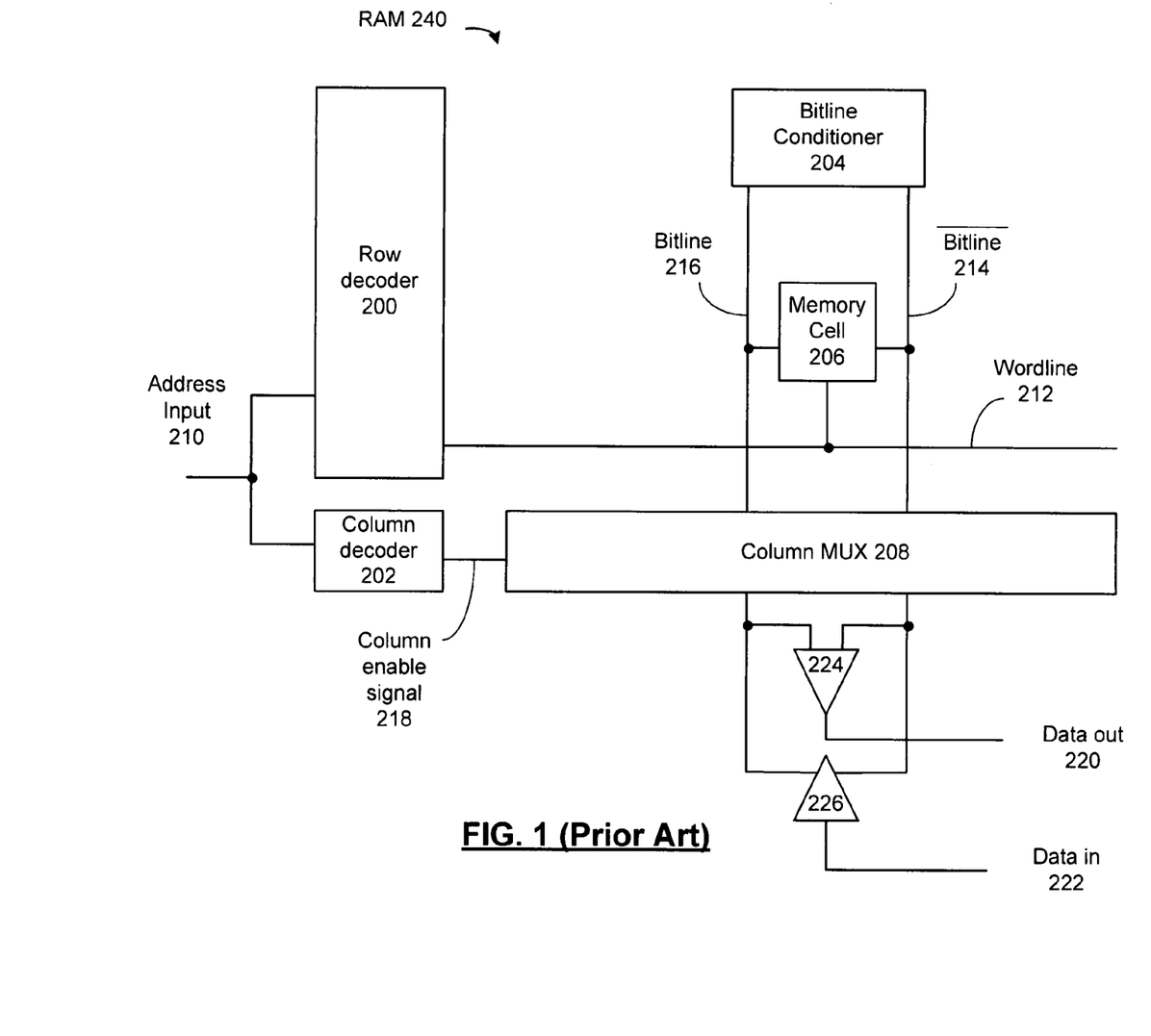
FIG. 1 presents a schematic block diagram representation of a prior art RAM 240.

FIG. 1 presents a schematic block diagram representation of a prior art RAM 240. In particular, a static RAM (SRAM) configuration is disclosed that includes an array of individual memory cells such as memory cell 206, that store binary values and that are arranged in a row and column format for ease in binary addressing. A particular memory cell, such as memory cell 206, is accessed by decoding the address 210 with row decoder 200 and column decoder 202. Row decoder 200 selects the particular wordline 212 that corresponds to the row of memory cells that contains memory cell 206. Column decoder 202 selects the particular complementary bitlines 214 and 216, driven by bitline conditioner 204, that correspond to the column of memory cells that contains memory cell 206. Column multiplexer (MUX) 208 couples the selected bitlines 214 and 216 to sense amplifier 224 and data buffer 226. Data are written to individual memory cells from data in line 222 and data buffer 226. Data are read from individual memory cells by sense amplifier 224 and are output on data out line 220.

Figure 2:
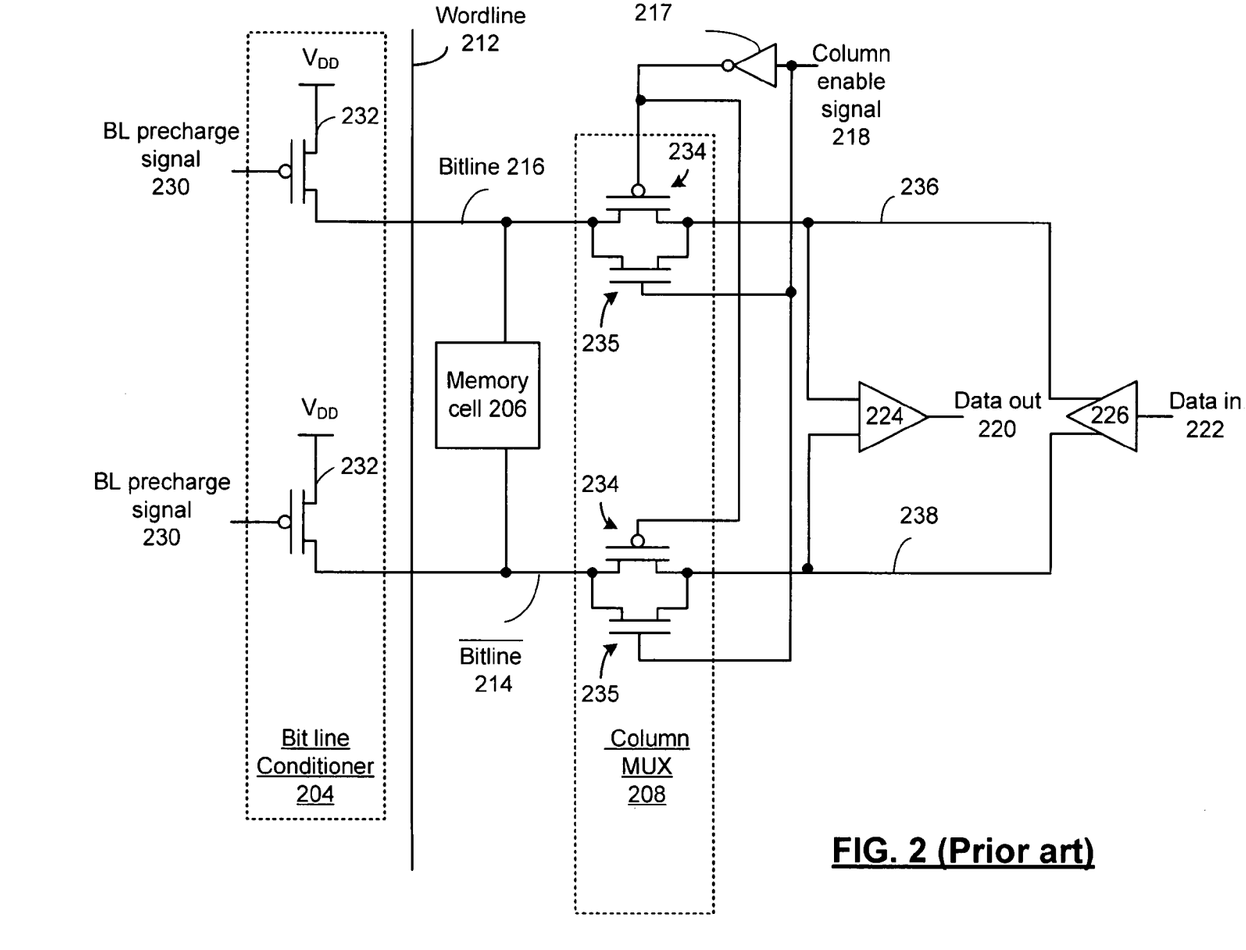
FIG. 2 presents a block/schematic diagram representation of a prior art bitline conditioner 204 and column multiplexer 208.

FIG. 2 presents a block/schematic diagram representation of a prior art bitline conditioner 204 and column multiplexer 208. P-channel metal oxide semiconductor (PMOS) transistors 232 precharge bitlines 214 and 216 in response to a bitline (BL) precharge signal 230. Column MUX 208 includes PMOS transistors 234 that, when turned on by column enable signal 218 during a read operation, pass the signals on the bitline 214 and 216 to sense amplifier inputs 236 and 238. When wordline 212 is activated, the voltage difference between bitlines 214 and 216 is passed to sense amplifier inputs 236 and 238 for conversion to data out 220 by sense amplifier 224. N-channel metal oxide semiconductor (NMOS) transistors 235, during a write operation, passes Vss (or a logic low level) to one of the bitlines 214 and 216 in response to data from data buffer 226.

Figure 3:
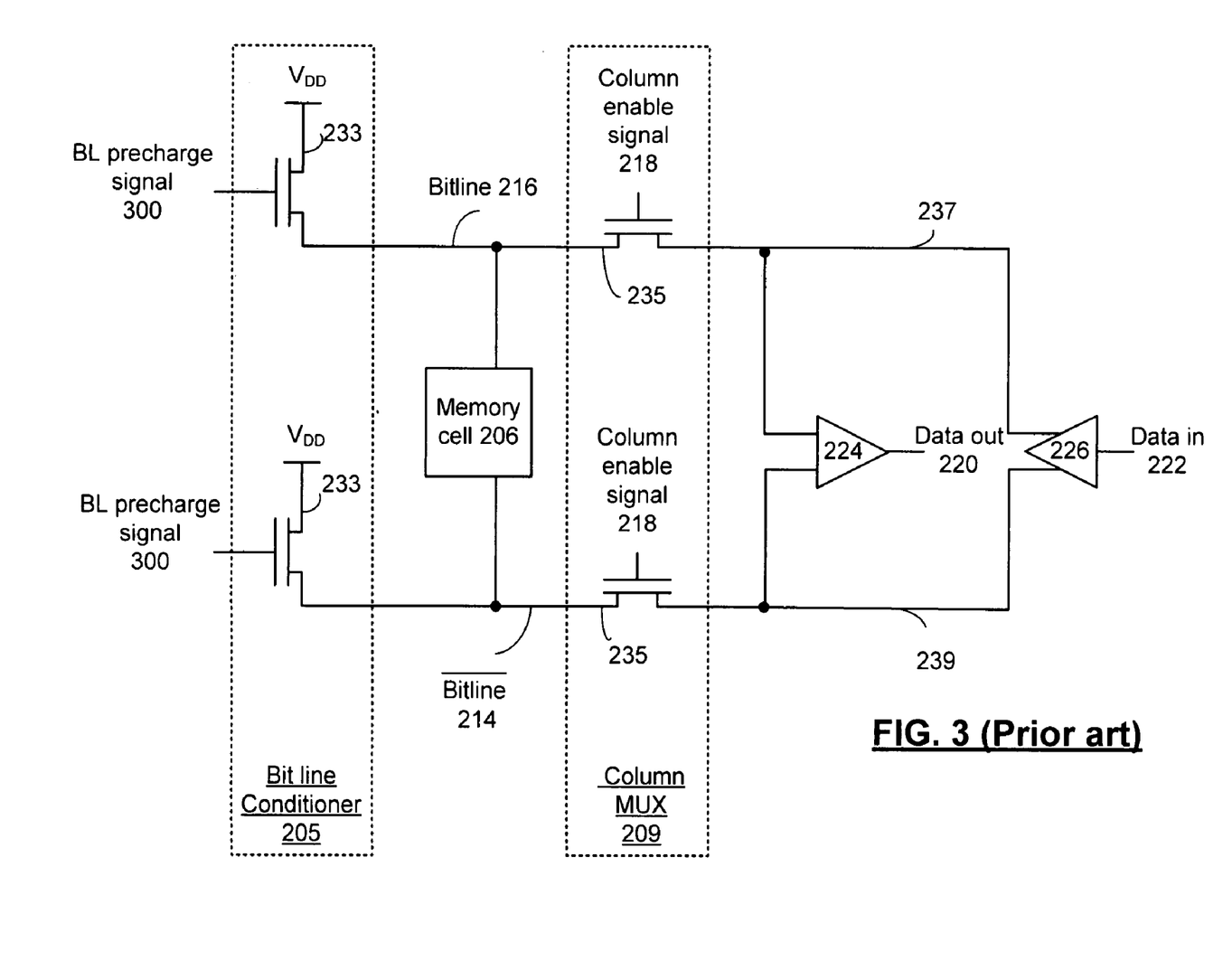
FIG. 3 presents a block/schematic diagram representation of an alternative prior art bitline conditioner 205 and column multiplexer 209.

The use of PMOS transistors 232 and 234 in bitline conditioner 204 and both PMOS transistors 234 and NMOS transistors 235 in column MUX 208 provides for a relatively reliable design, however, this configuration requires greater memory bit cell array peripheral area and consumes more power when compared with the alternative prior art design shown in FIG. 3 that follows.

FIG. 3 presents a block/schematic diagram representation of an alternative prior art bitline conditioner 205 and column multiplexer 209. In particular, NMOS transistors 233 are used to implement bitline conditioner 205 and an NMOS only column MUX 209 is implemented with transistors 235.

One of the common ways to save power of a memory is a block activation or segmented array architecture. This segmented configuration decreases the length of the bitlines and lowers the bitline capacitance, allowing for faster bitline discharge and consequently faster read operations or conversely, lower power consumption. However, the silicon area overhead created by the greater memory peripheral area makes these segmented configurations costly to implement because each memory segment requires it own bitline conditioner and column multiplexer. Because this design uses less peripheral overhead than the prior art circuit described in FIG.2, the alternative prior art design of FIG. 3 is more suitable for a segmented array memory architecture. In particular, NMOS transistors 233 occupy less area than PMOS transistors 232 and the elimination of inverter 217 and PMOS transistor 234 also saves space in the design that is replicated for each bitline pair However, NMOS transistors 233 can generate an unpredictable precharge level due to NMOS transistor leakage, variations in drain voltage, etc. In particular, if the precharge level increases to a voltage level greater than the drain voltage $V_{DD}$, minus the NMOS threshold voltage $V_T$, the time until the bitline voltages 214 and 216 are transferred to the sense amplifier side of column MUX transistors 235 becomes unpredictable.

The need exists for memory devices that consume less power and that can be implemented efficiently in integrated circuit designs.

DETAILED DESCRIPTION OF THE INVENTION INCLUDING THE PRESENTLY PREFERRED EMBODIMENTS

Figure 4:
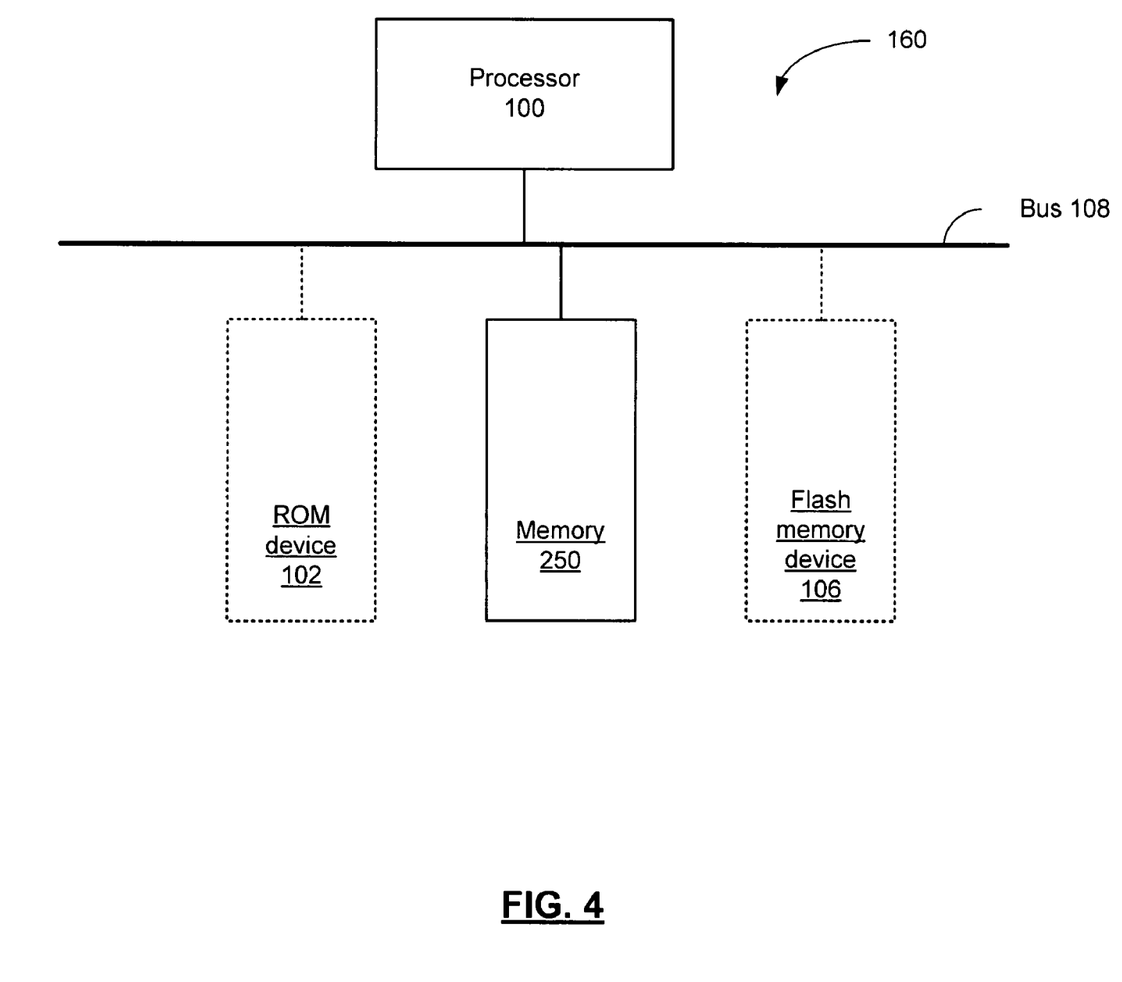
FIG. 4 presents a combination schematic/block diagram representation of a processing system 160 in accordance with an embodiment of the present invention.

FIG. 4 presents a combination schematic/block diagram representation of a processing system 160 in accordance with an embodiment of the present invention. In particular, a processing system 160 is presented that includes a processor 100 that is coupled to optional read only memory (ROM) device 102, random access memory (RAM) device 250, and optional flash memory device 106 via bus 108. Memory 250 includes novel power saving and space saving features as will be described in further detail in conjunction with the figures that follow.

Figure 5:
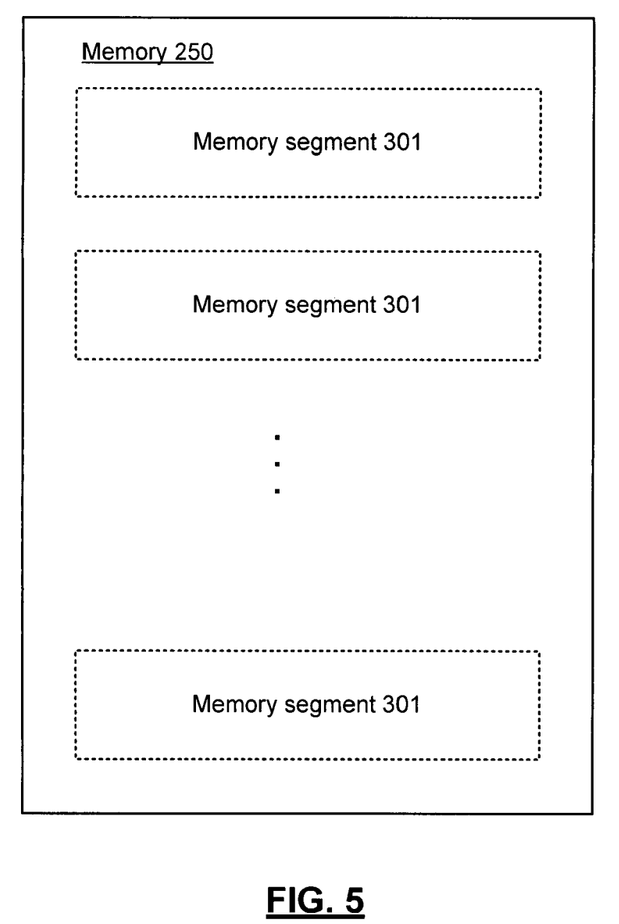
FIG. 5 presents a schematic block diagram representation of a memory 250 in accordance with an embodiment of the present invention.

FIG. 5 presents a schematic block diagram representation of a memory 250 in accordance with an embodiment of the present invention. In particular, a segmented memory architecture is employed that includes a plurality of memory segments 301. The segmentation of the memory array provides decreased bitline length and lower bitline capacitance. The read voltage delta between bitlines 214 and 216 increases more quickly. Thus, this is a desirable configuration for stable RAM operation as long as the increase in peripheral overhead can be reduced to an acceptable amount. In an embodiment of the present invention, the memory peripheral area is reduced by employing NMOS bitline conditioning and NMOS only column multiplexer circuitry. The potential problems associated with unstable bitline precharge conditions associated with this configuration, are addressed in conjunction with a multiplexer output conditioner that discharges the bitlines' precharge level from the sense amplifier side of the column multiplexer. This and other advantages will be apparent based on the discussions of the features and functions of the invention described more fully herein.

Figure 6:
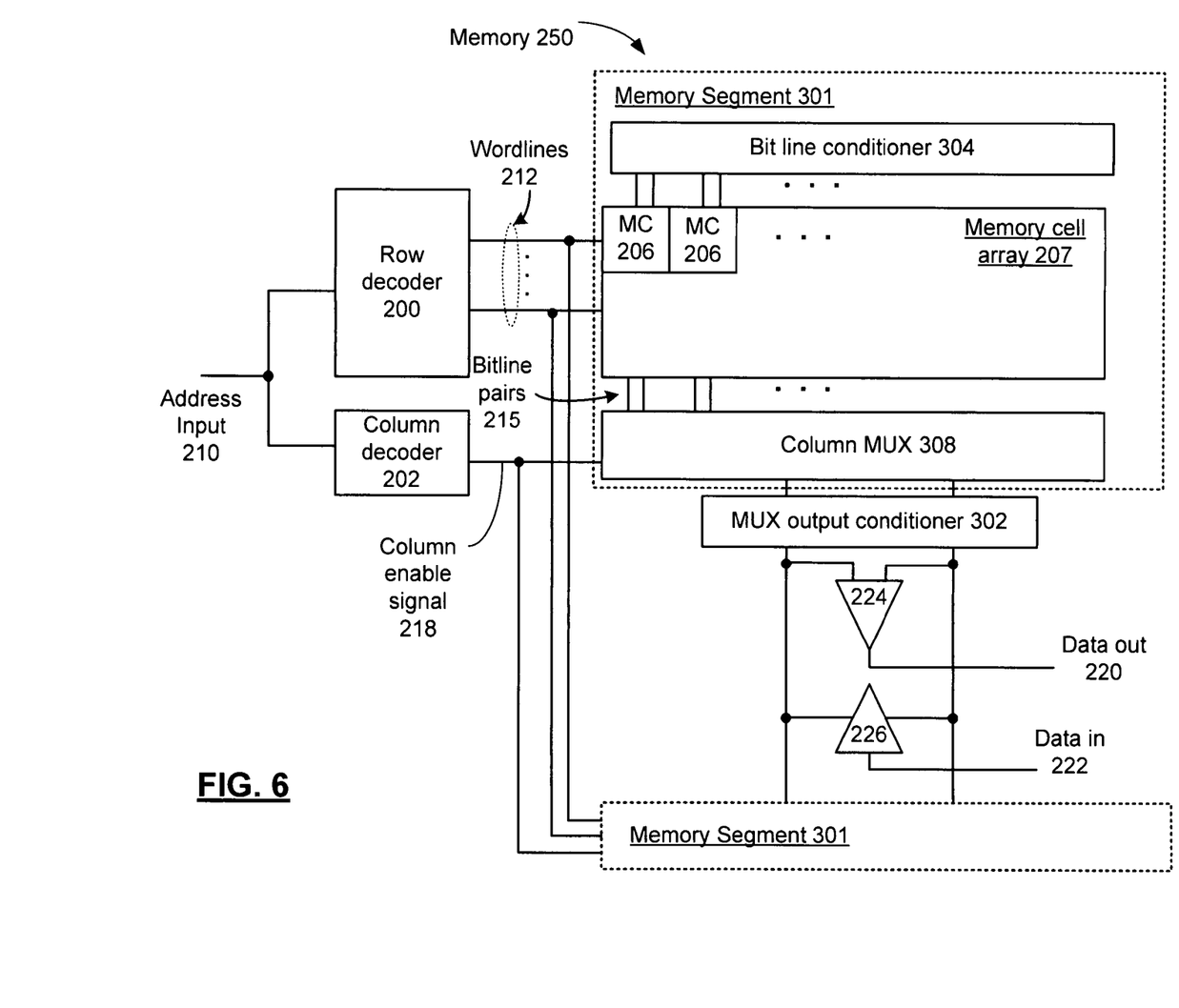
FIG. 6 presents a schematic block diagram representation of a memory 250 in accordance with an embodiment of the present invention.

FIG. 6 presents a schematic block diagram representation of a memory 250 in accordance with an embodiment of the present invention. In an embodiment of the present invention, memory 250 is a static RAM (SRAM) device that includes one or more memory segments 301 that contain a memory cell array 207 of individual memory cells 206 that are arranged in a row and column format for ease in binary addressing. FIG. 6 presents a configuration with two memory segments 301, where one of the memory segments has been expanded to show the bit line conditioner 304, memory cell array 207 and column multiplexer 308 that are contained therein. Memory cells 206 can be implemented using complementary metal oxide semiconductor (CMOS) transistors, n-channel metal oxide semiconductor (NMOS) transistors, or with other transistors or electrical devices within the broad scope of the present invention. A particular memory cell is accessed by decoding the address 210 with row decoder 200 and column decoder 202. Row decoder 200 selects one of the wordlines 212 that corresponds to the row of memory cells that contains the selected memory cell. Column decoder 202 selects one of the complementary bitline pairs 215 corresponding to the column of memory cells that contains the particular memory cell. Column multiplexer (MUX) 308 couples the selected bitline pair 215 to sense amplifier 224 and data buffer 226. Data are written to individual memory cells from data in line 222 and data buffer 226. Data are read from individual memory cells by sense amplifier 224 and are output on data out line 220.

In an embodiment of the present invention, memory 250 includes multiplexer (MUX) output conditioner 302 for conditioning the output of column MUX 308, allowing more efficient designs of column MUX 308 as will be discussed in greater detail in conjunction with FIG. 7 below.

Figure 7:
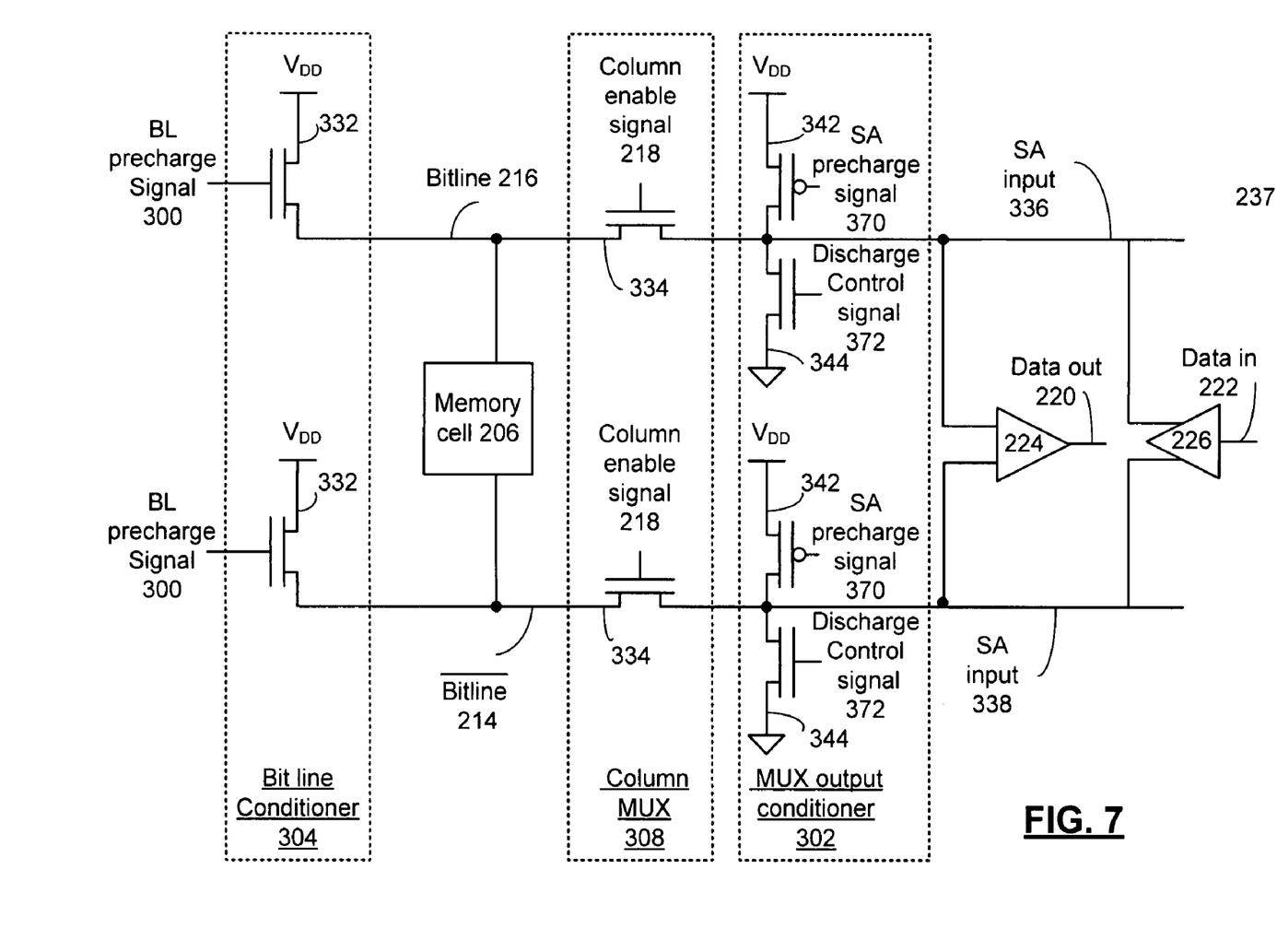
FIG. 7 presents a block/schematic diagram representation of bit line conditioner 304, column MUX 308 and MUX output conditioner 302 in accordance with an embodiment of the present invention.

FIG. 7 presents a block/schematic diagram representation of bit line conditioner 304, column MUX 308 and MUX output conditioner 302 in accordance with an embodiment of the present invention. In particular, multiplexer (MUX) output conditioner 302 discharges bitline 214 and 216 from the sense amplifier side. This allows bitline conditioner 304 to more accurately precharge and readjust bitlines 214 and 216 to a precharge threshold. The additional circuitry required to perform the functions of MUX output conditioner 302 are implemented only once in the memory 250 due to their location on the sense amplifier 224 side of the column MUX 308, as opposed to be implemented for each pair of bitlines of memory array 207. This configuration saves space in the design and is more efficient because only the selected bitline pair precharge level is readjusted.

In operation, prior to the assertion of read clock 398 (or precharge period), NMOS transistors 332 respond to bitline precharge signal 300 to precharge bitlines 214 and 216 to $V_{DD}-V_T$, PMOS transistor 344 responds to sense amp precharge signal 370 to precharge sense amplifier inputs 336 and 338 to full $V_{DD}$ and to equalize sense amplifier inputs 336 and 338. In addition, NMOS column MUX pass gate transistors 334 pass the voltage of bitlines 214 and 216 to sense amplifier inputs 338 and 336, respectively, in response to column enable signal 218 having a value of $V_{DD}$ prior to or right after the assertion of read clock 398.

Depending on the length of the precharge period and the amount of NMOS leakage, the bitline precharge level could be higher than a desirable precharge threshold (slightly less than $V_{DD}-V_T$). MUX output conditioner 302 corrects this potential problem associated with NMOS only column MUX implementations. In operation, at the assertion of the read clock 398, NMOS transistors 344 discharge sense amplifier inputs 336 and 338 in response to discharge control signal 372. During this time, NMOS transistors 332 are still on (and remain on until the assertion of wordline 212). Consequently, bitlines 214 and 216 are pulled up as soon as the discharge control signal 372 goes low.

Thus, with this scheme, it is possible to readjust bitlines 214 and 216 to a voltage level that is slightly less than $V_{DD}-V_T$ more consistently by the time wordline 212 is asserted. This scheme allows a segmented array architecture to be implemented in a more practical manner. With a segmented memory, also a simpler design of sense amplifier 224 is possible that can reduce the sense amplifier related precharge and trigger related circuit complexity.

While the embodiment of the present invention described above uses the particular circuit configurations shown, one skilled in the art when presented the teachings disclosed herein will understand that other circuit configurations, particularly using other transistors, diodes and other circuit elements can likewise be used to implement the broader features and functions of the present invention.

Figure 8:
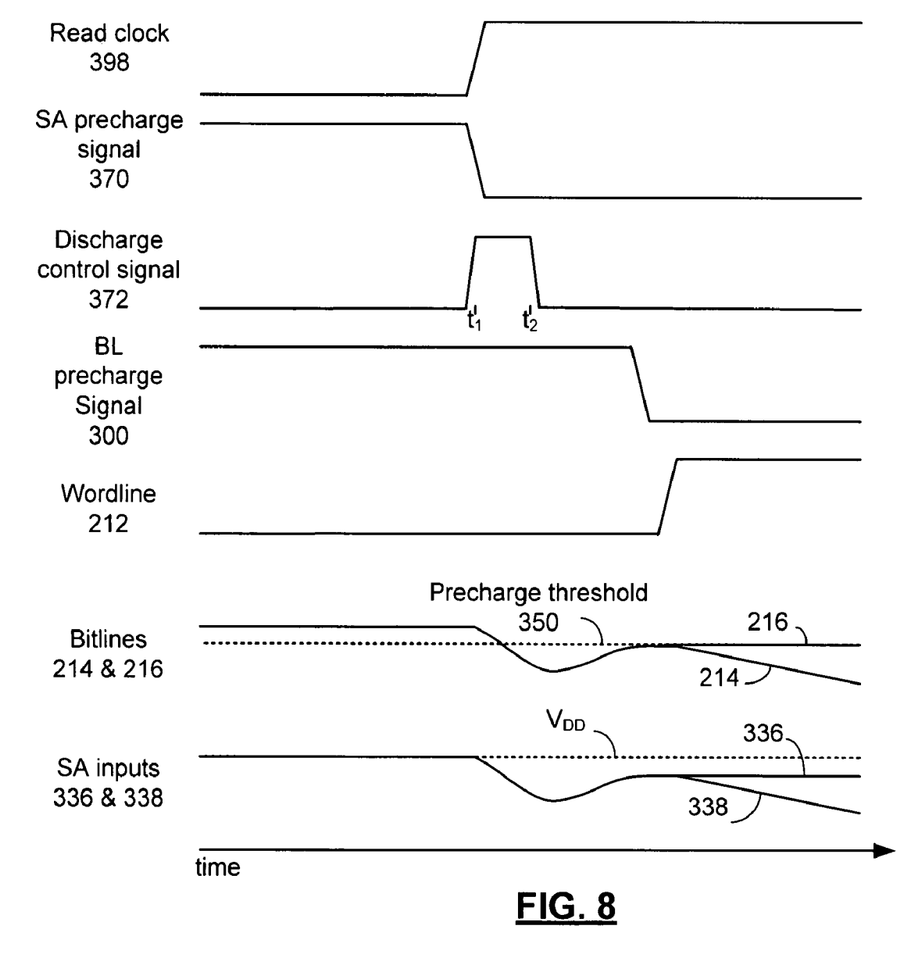
FIG. 8 presents a graphical representation of a timing diagram in accordance with an embodiment of the present invention.

FIG. 8 presents a graphical representation of a timing diagram in accordance with an embodiment of the present invention. In particular, due to the possible long precharge period and NMOS leakage as previously described, the precharge level of the bitlines, such as bitlines 214 and 216 could have drifted above the desired precharge threshold 350 (slightly less than $V_{DD}-V_T$). Sense amplifier precharge signal 370 keeps the sense amplifier inputs 336 and 338 at a full $V_{DD}$ level until PMOS transistor 342 is deactivated in response to clock signal 398. Discharge control signal 372 begins a pulse that discharges the sense amplifier input 336, such as by transistor 344, causing a drop in bitlines 214 and 216 of a limited duration. When discharge control signal 372 is de-asserted, bitlines 214 and 216 are pulled up by NMOS transistors 332. Since NMOS transistors 332 are used in a source follower mode, the bitline precharge level is very close to the precharge threshold, prior to the activation of wordline 212.

In an embodiment of the present invention, bitline precharge signal, discharge control signal 372 and sense amplifier precharge signal 370 operate on transistors 332, 344 and 342 to provide the discharge and precharge cycles presented in conjunction with FIGS. 6-8. In an embodiment of the present invention the discharge control signal 372 is generated by a pulse generator or other circuit so as to have a predetermined duration $t_2-t_1$. In a further embodiment of the present invention, a voltage level detector is used to end the pulse after a predetermined voltage level is reached. In either case, the discharge is controlled to provide a sufficient voltage drop to provide reliable operation of transistors 334 of column MUX 308, yet to provide transistors 332 sufficient time to precharge bitlines 214 and 216 to the precharge threshold.

Figure 9:
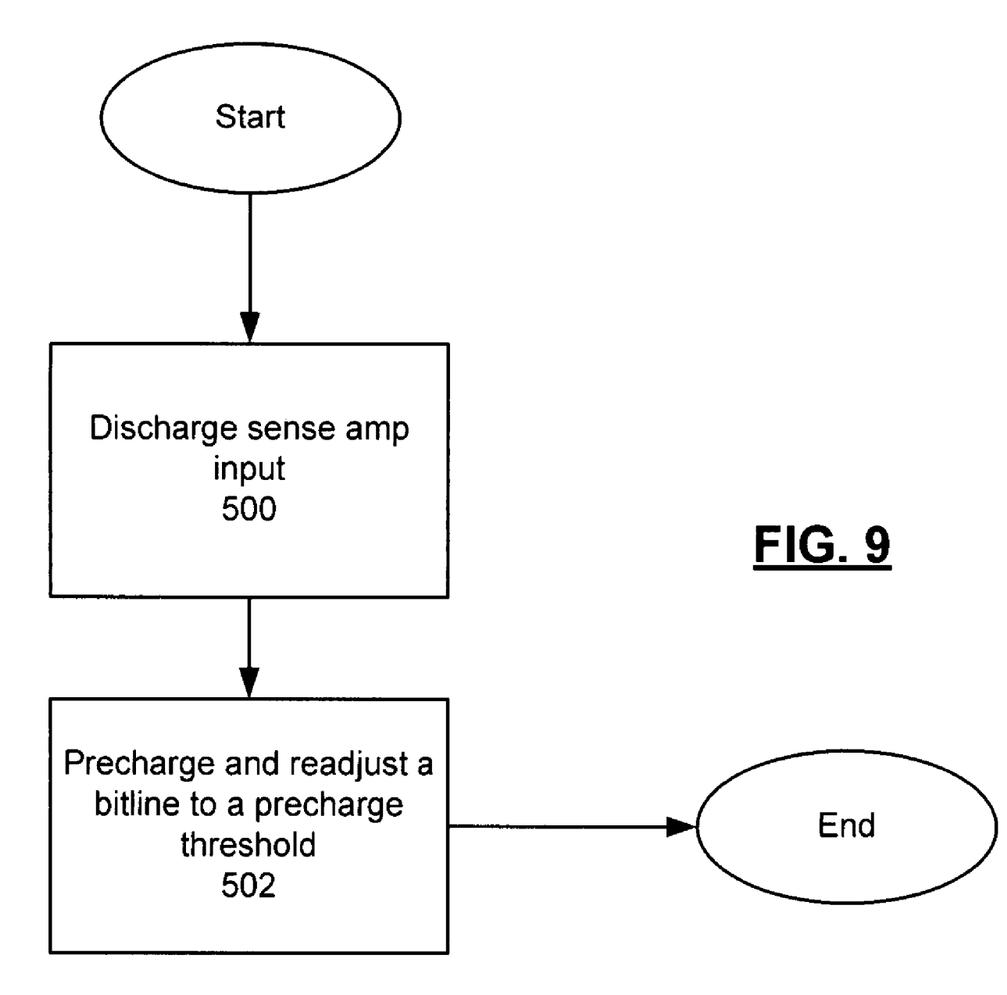
FIG. 9 presents a flowchart representation of a method in accordance with an embodiment of the present invention.

FIG. 9 presents a flowchart representation of a method in accordance with an embodiment of the present invention. In particular, a method for conditioning a sense amplifier input of a memory array during a read operation is presented that can operate in conjunction with the various features, functions, structure and implementations presented in conjunction with FIGS. 4-8. The method begins in step 500 by discharging the sense amplifier input. In step 502, the method continues by precharging and readjusting a bitline to a precharge threshold.

In accordance with an embodiment of the present invention, step 500 includes discharging the sense amplifier input for a predetermined duration. In a preferred embodiment, steps 500 and 502 are performed prior to activation of a wordline during a read operation.

Figure 10:
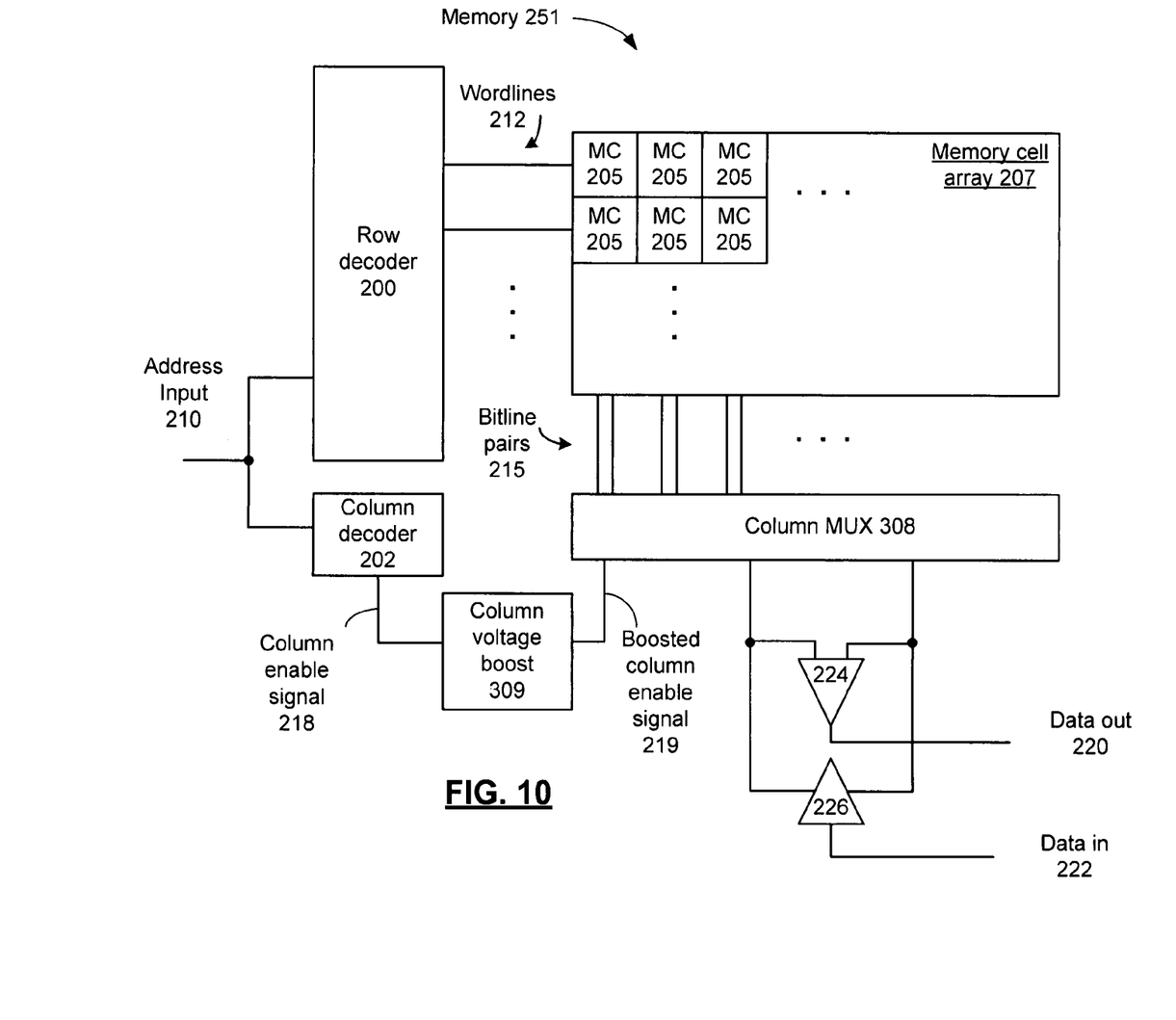
FIG. 10 presents a block diagram representation of a memory 251 in accordance with an embodiment of the present invention.

FIG. 10 presents a block diagram representation of a memory 251 in accordance with an embodiment of the present invention. In this embodiment, an alternative apparatus and method are presented for compensating for the possible problem associated with NMOS only column MUX implementations where precharge levels are above the desired precharge threshold. In particular, a column voltage booster 309 is operably coupled to a column enable signal 218, to produce a boosted column enable signal 219.

In an embodiment of the present invention, a bootstrapped circuit is used to increase the voltage of column enable signal 218 for a limited duration of time that includes some portion or all of the time that the column enable signal is pulsed high during a read operation. Other circuit configurations including dc-to-dc converters, step-up circuits or other circuits can likewise be used.

Figure 11:
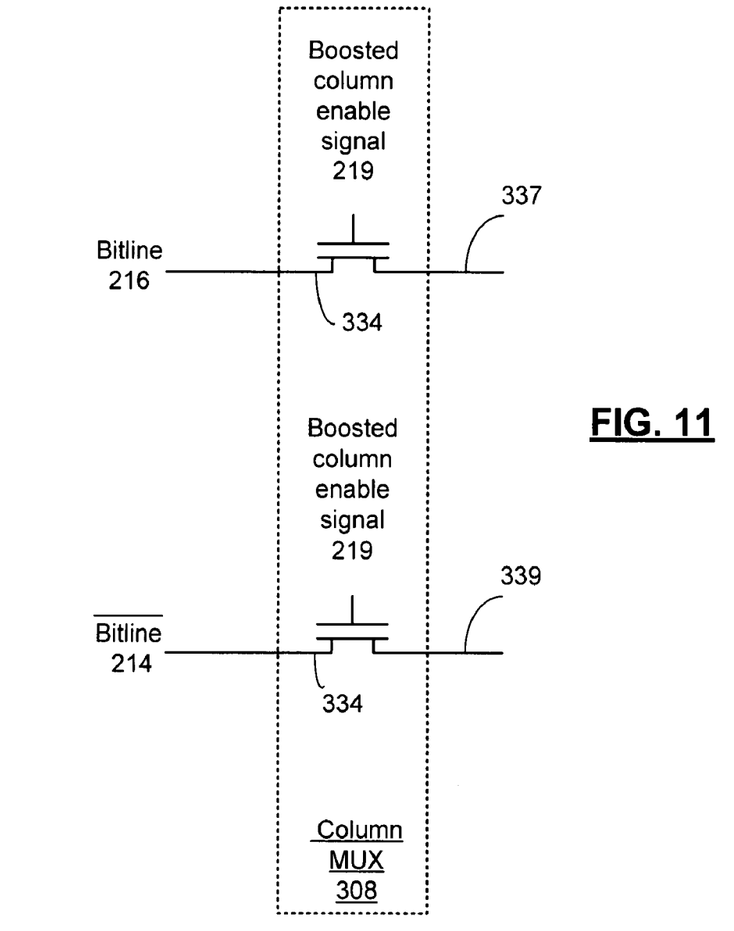
FIG. 11 presents a schematic/block diagram representation of a column multiplexer 308 in accordance with an embodiment of the present invention.

FIG. 11 presents a schematic/block diagram representation of a column multiplexer 308 in accordance with an embodiment of the present invention. NMOS transistors 334 selectively couple bitlines 214 and 216 to sense amplifier inputs 337 and 339 that are operably coupled to sense amplifier 224. Column multiplexer 308 passes the signal on the selected bitlines in response to the boosted column enable signal 219, even when the signal has drifted above a precharge threshold. Boosting the voltage of column enable signal, to create boosted column enable signal 219, increases the gate voltage of NMOS transistors 334 above $V_{DD}$. This voltage increase can compensate for a possible increased precharge level on bitlines 214 and 216 due to an NMOS implementation of bit line conditioner 304. In operation, the magnitude of boosted column enable signal 219 can be any voltage of sufficient magnitude and polarity to support the proper operation of column multiplexer 308 during a read operation of memory cell 206. In an embodiment of the present invention, this boosting operation happens during read mode (at least prior to the assertion of wordline 212). During the precharge period, it should not be boosted. Otherwise, the full $V_{DD}$ level at the sense amplifier side of column multiplexer 308 would be transferred to the bitlines 214 and 216.

Figure 12:
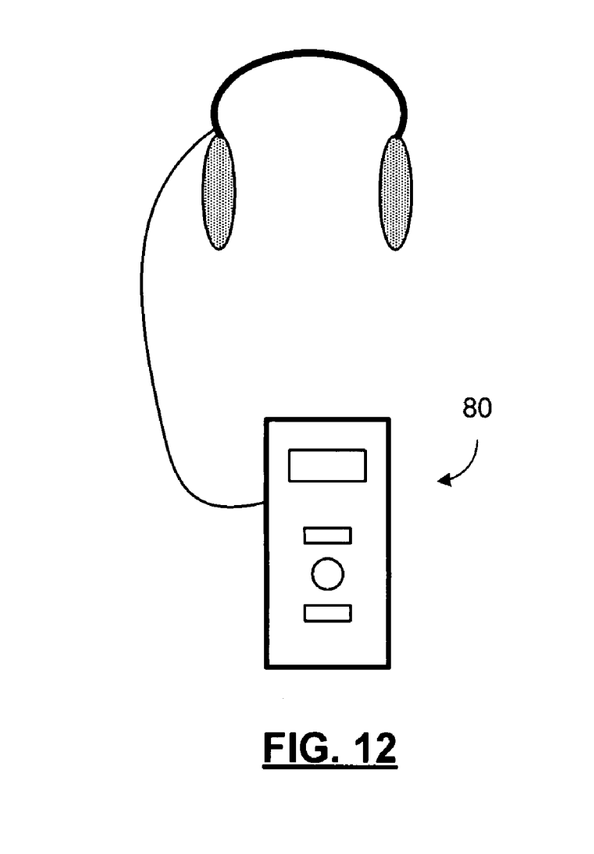
FIGS. 12-14 present pictorial diagrams of various devices in accordance with an embodiment of the present invention.
Figure 13:
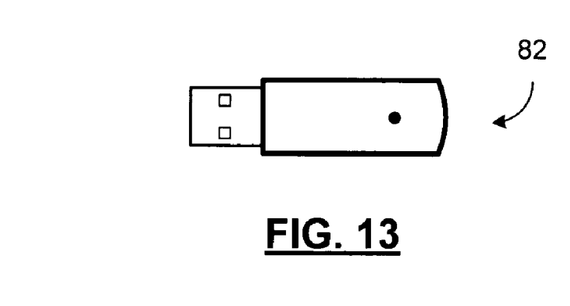
Figure 14:
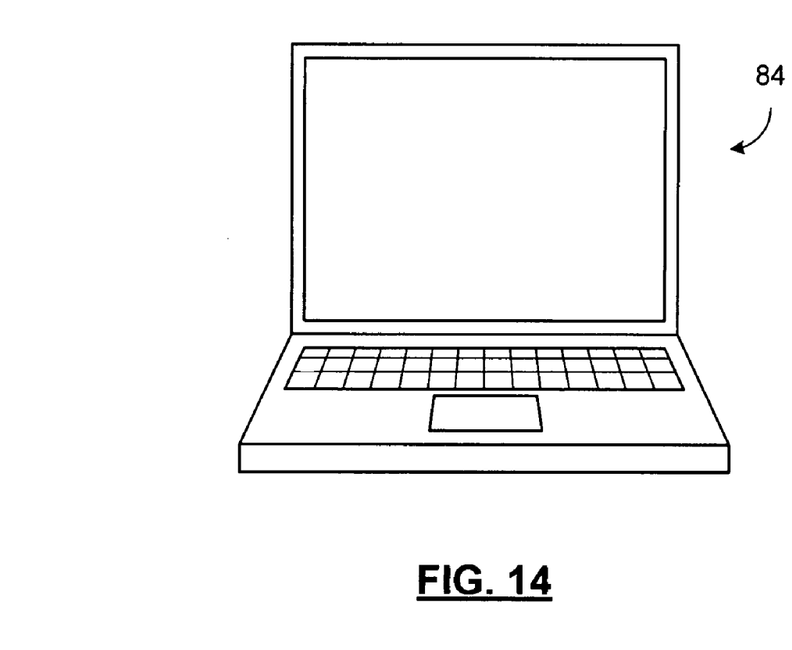

FIGS. 12-14 present pictorial diagrams of various devices in accordance with an embodiment of the present invention. While the preceding disclosure has been directed to a memory 250 or 251 used in conjunction with a processing system 160, in an embodiment of the present invention, memory 250 or 251 may be implemented by itself in an integrated circuit such as a memory chip. While implemented as a memory chip, as part of a processing system 160 or as part of a system on a chip integrated circuit, memory 250 or 251 can be used in a wide variety of electronic devices such as handheld audio system 80, universal service bus (USB) device 82, in computer 84, or in a variety of other electronic devices that employ memory devices.

The various processors disclosed herein can be implemented using a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated herein.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The various circuit components can be implemented using 0.08 to 0.35 micron CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a memory and a processing system. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A processing system comprising:
    a processor,
    memory device, operably coupled to the processor, the memory device including:
        an array of memory cells;
        a selected bitline operably, coupled to the array of memory cells, that is precharged to produce a precharged bitline signal;
        a column voltage booster, operably coupled to a column enable signal, to produce a boosted column enable signal;
        a column multiplexer, having a first node coupled to the selected bitline and a second node coupled to a sense amplifier input, for passing the precharged bitline signal to the sense amplifier input in response to the boosted column enable signal; and
        a sense amplifier, operably coupled to the sense amplifier input, for producing a data output.

2. The processing system of claim 1 further comprising:
    an n-channel, metal oxide semiconductor (NMOS) transistor, operably coupled to the selected bitline, for passing the precharged bitline signal on the selected bitline even when the signal has drifted above a precharge threshold.

3. The processing system of claim 1 wherein the column multiplexer includes an n-channel metal oxide semiconductor (NMOS) transistor.

4. A memory comprising:
    an array of memory cells;
    a selected bitline, operably coupled to the array of memory cells, that is precharged to produce a precharged bitline signal;
    a column voltage booster, operably coupled to a column enable signal, to produce a boosted column enable signal;
    a column multiplexer, having a first node coupled to the selected bitline and a second node coupled to a sense amplifier input, for passing the precharged bitline signal to the sense amplifier input in response to the boosted column enable signal; and
    a sense amplifier, operably coupled to the sense amplifier input, for producing a data output.

5. The memory of claim 4 further comprising:
    an n-channel metal oxide semiconductor (NMOS) transistor, operably coupled to the selected bitline, for passing the precharged bitline signal on the selected bitline even when the signal has drifted above a precharge threshold.

6. The memory of claim 4 wherein the column multiplexer includes an n-channel metal oxide semiconductor (NMOS) transistor.

* * * * *